United States Patent
Hekmatshoartabari et al.

(10) Patent No.: US 9,087,941 B2
(45) Date of Patent: Jul. 21, 2015

(54) SELECTIVE SELF-ALIGNED PLATING OF HETEROJUNCTION SOLAR CELLS

(71) Applicant: INTERNATIONAL BUSINESS MACHINES CORPORATION, Armonk, NY (US)

(72) Inventors: Bahman Hekmatshoartabari, White Plains, NY (US); Warren S. Rieutort-Louis, Voorschoten (NL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/031,732

(22) Filed: Sep. 19, 2013

(65) Prior Publication Data
US 2015/0075598 A1 Mar. 19, 2015

(51) Int. Cl.
*H01L 21/00* (2006.01)
*H01L 31/0224* (2006.01)
*H01L 31/20* (2006.01)
*H01L 31/18* (2006.01)
*H01L 31/0216* (2014.01)

(52) U.S. Cl.
CPC .. *H01L 31/022466* (2013.01); *H01L 31/02168* (2013.01); *H01L 31/1884* (2013.01); *H01L 31/20* (2013.01)

(58) Field of Classification Search
None
See application file for complete search history.

(56) References Cited

U.S. PATENT DOCUMENTS

| | | | |
|---|---|---|---|
| 4,528,418 A | 7/1985 | McGill | |
| 5,342,453 A | 8/1994 | Olson | |
| 5,641,362 A | 6/1997 | Meier | |
| 7,943,416 B2 * | 5/2011 | Scherff et al. | 438/94 |
| 8,399,331 B2 | 3/2013 | Moslehi et al. | |
| 2010/0059117 A1 | 3/2010 | Shi et al. | |
| 2011/0041899 A1 | 2/2011 | Josell et al. | |
| 2011/0162703 A1 | 7/2011 | Adibi et al. | |
| 2012/0055546 A1 | 3/2012 | Turner | |
| 2012/0060908 A1 | 3/2012 | Crafts | |
| 2012/0240995 A1 | 9/2012 | Coakley | |
| 2012/0244723 A1 | 9/2012 | Franklin et al. | |

FOREIGN PATENT DOCUMENTS

WO WO2009094564 A2 7/2009

OTHER PUBLICATIONS

Descoeudres, A., et al. "Optimization of High Efficiency Silicon Heterojunction Solar Cells Using Silane-Plasma Diagnostics" 25th European Photovoltaic Solar Energy Conference and Exhibition. Sep. 2010. pp. 2069-2073.

(Continued)

*Primary Examiner* — Seahvosh Nikmanesh
(74) *Attorney, Agent, or Firm* — Tutunjian & Bitetto, P.C.; Louis J. Percello (57) ABSTRACT

A method for forming contacts on a photovoltaic device includes forming a heterojunction cell including a substrate, a passivation layer and a doped layer and forming a transparent conductor on the cell. A patterned barrier layer is formed on the transparent conductor and has openings therein wherein the transparent conductor is exposed through the openings in the barrier layer. A conductive contact is grown through the openings in the patterned barrier layer by a selective plating process.

14 Claims, 6 Drawing Sheets

(56) References Cited

OTHER PUBLICATIONS

Holman, Z., et al. "Current Losses at the Front of Silicon Heterojunction Solar Cells" IEEE Journal of Photovoltaics, Vol. 2, No. 1. Jan. 2012. pp. 7-15.

Lachenal, D., et al. "High Efficiency Silicon Heterojunction Solar Cell Activities in Neuchatel, Switzerland" 25th European Photovoltaic Solar Energy Conference and Exhibition. Sep. 2010. pp. 1272-1275.

Page, M., et al. "Progress in Silicon Heterojunction Devices by Hot-Wire CVD" 14th Workshop on Crystalline Silicon Solar Cells and Modules. Aug. 2004. pp. 1-4.

Wang, T., et al. "Toward Better Understanding and Improved Performance of Silicon Heterojunction Solar Cells" 14th Workshop on Crystalline Silicon Solar Cells and Modules. Aug. 2004. pp. 1-8.

Wang, Q., et al. "Light Trapping for High Efficiency Heterojunction Crystalline SI Solar Cells" China Semiconductor Technology International Conference. Mar. 2011. pp. 1-6.

* cited by examiner

SELECTIVE SELF-ALIGNED PLATING OF HETEROJUNCTION SOLAR CELLS

BACKGROUND

1. Technical Field

The present invention relates to photovoltaic devices, and more particularly to methods and photovoltaic devices with plated electrodes.

2. Description of the Related Art

The formation of highly conductive metal contacts on heterojunction solar cells remains a challenge due to low-temperature processing limitations and/or the use of expensive materials and methods (e.g., employing silver paste to form metal contacts). Chemical solution deposition processes often attack less robust transparent conductive oxide materials and can result in efficiency losses.

SUMMARY

A method for forming contacts on a photovoltaic device includes forming a heterojunction cell including a substrate, a passivation layer and a doped layer and forming a transparent conductor on the cell. A patterned barrier layer is formed on the transparent conductor and has openings therein wherein the transparent conductor is exposed through the openings in the barrier layer. A conductive contact is grown through the openings in the patterned barrier layer by a selective plating process.

Another method for forming contacts on a photovoltaic device includes forming a heterojunction cell including a substrate, at least one passivation layer and at least one doped layer; depositing a transparent conductor on the cell; depositing a barrier layer over the transparent conductor; patterning a mask over the barrier layer; etching the barrier layer through openings in the mask to expose portions of the transparent conductor through the openings in the barrier layer; depositing a seed layer over the mask and the exposed portions of the transparent conductor; removing the mask and seed layer on the mask by a lift-off process; and growing a conductive contact through the openings in the barrier layer on the seed layer by a selective plating process.

A photovoltaic device includes a heterojunction cell including a substrate, at least one passivation layer and at least one doped layer. A transparent conductor is formed on the cell. A patterned barrier layer is formed on the transparent conductor and has openings formed therein. A plated conductive contact is formed through the openings in the patterned barrier layer by a selective plating process.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, methods for metalizing bottom or top contacts for photovoltaic devices are provided through selective plating. In particularly useful embodiments, selective plating is useful for heterojunction solar cells with conductive layers at emitter contacts. In one embodiment, a thin insulating layer is formed on a surface of a conductive layer and is selectively patterned to create openings for metal plating. The insulating property of the layer confines the electroplating of contacts to the openings, while preventing corrosion of the conductive layers by plating solutions. A small thickness of the insulating layer minimizes parasitic absorption. This process also permits the use of light-induced plating.

In accordance with the present embodiments, heterojunction solar cells having crystalline silicon (c-Si) substrates passivated by thin layers of amorphous silicon (a-Si) may now be fabricated with electroplated metal contacts. In one embodiment, electroplating of, e.g., Cu may be employed. For heterojunction solar cells, metallization is particularly challenging since low temperature processes are needed when hydrogenated a-Si (a-Si:H) is employed. Silver plating (curing process at 400° C.) is incompatible with a-Si:H. A low-temperature silver paste can be employed, but is even more expensive than silver plating.

Plating in accordance with the present principles controls where metal growth occurs and avoids metal growth everywhere on the transparent conductive oxide electrode (e.g., indium tin oxide (ITO) or ZnO:Al), which is conductive. A patterned barrier is provided, which is insulating, chemically resistant to the electroplating solution, and in case of light-induced plating, sufficiently transparent. The barrier layer prevents corrosion of the conductive electrode (ITO or ZnO:Al) due to typical electroplating solutions.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for independent use, integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case, the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., SiC. These compounds include different proportions of the elements within the compound, e.g., SiC includes $Si_xC_{1-x}$ where x is less than or equal to 1, etc. In addition, other elements may be included in the compound, such as, e.g., dopants, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc. It is also to be understood that the present invention may include tandem structures with stacked cells.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
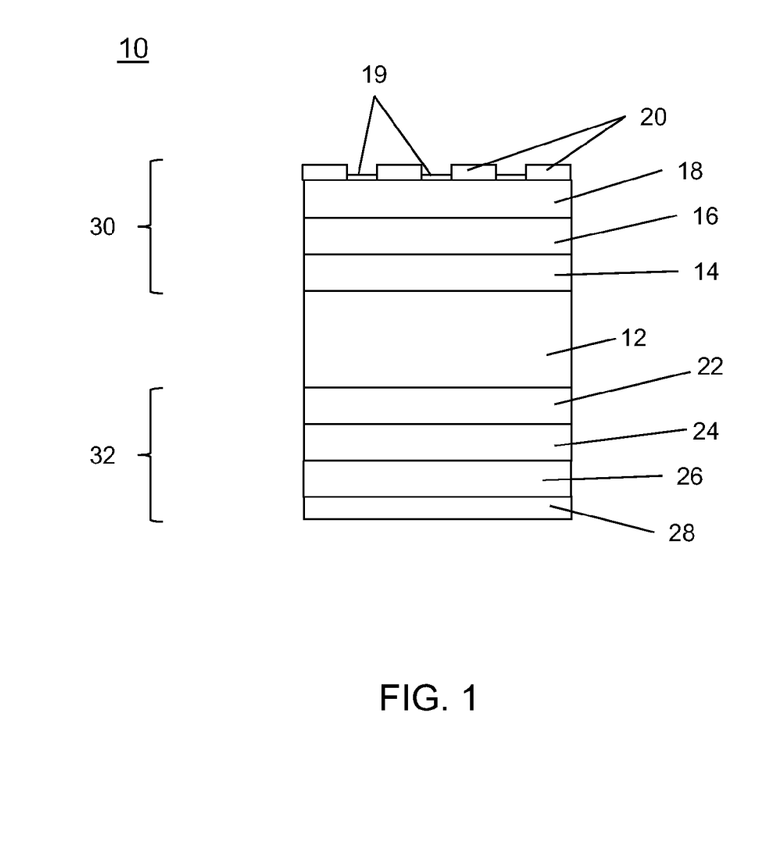
FIG. 1 is a cross-sectional view of a heterojunction photovoltaic device in accordance with the present principles.

Referring now to the drawings in which like numerals represent the same or similar elements and initially to FIG. 1, an illustrative structure of a heterojunction photovoltaic device 10 with a substrate 12 is shown. The substrate 12 preferably includes silicon and may be single-crystalline (c-Si) or multi-crystalline Si. Other substrate materials may also be employed. The substrate 12 may include a textured or non-textured surface or surfaces. Textured surfaces maybe designed to provide light trapping and carry the textured features throughout the other layers of the device.

The substrate 12 may be p-type or n-type. The substrate 12 includes an emitter or front contact and a back contact. The word "contact" is employed to refer to the structure connected to the substrate 12, which may include an emitter/front contact or a back contact. Since these contacts also include conductive contacts as well, to prevent confusion, the contacts will be referred to as front side 30 and back side 32.

In accordance with one embodiment, the front side 30 of the substrate 12 includes a passivation layer 14, which may include hydrogenated amorphous Si (a-Si:H), and a doped emitter layer 16, which may include doped a-Si:H, e.g., n+ doped with a p-type substrate, although a p-doped layer may also be employed with an n-type substrate. The doped layer 16 may have a thickness of less than 10 nm, and the passivation layer 14 may have a thickness of less than 10 nm.

A transparent conductive material or layer 18 such as a transparent conductive oxide (TCO) is formed to reduce lateral resistance for carrier collection at the electrodes.

Examples of the transparent conductive layer 18 include but are not limited to indium-tin-oxide (ITO) and aluminum-doped zinc-oxide (ZnO:Al or AZO). The TCO layer 18 may serve as an anti-reflection coating (ARC) on the front side 30. In one embodiment, the TCO layer 18 may be comprised of a plurality of transparent layers and/or antireflection layers.

In one embodiment, the layer 18 may include a multi-layer ARC stack. The stack may be optimized for lower reflection, e.g., a top ARC (that receives incident radiation first) may include a lower refractive index than an underlying ARC of layer 18. The refractive indices of the ARC layers, which may include ITO as the lower ARC (conductive) and $MgF_2$ as the top ARC (dielectric), may have optimized thicknesses to reduce reflection of the solar spectrum.

Metal fingers 20 are selectively grown/patterned using a dielectric barrier layer 19 patterned on the transparent conductive layer 18. The metal fingers 20 are formed using a plating process in accordance with the present principles as will be described.

In accordance with the present principles, the back side 32 of the substrate 12 includes a passivation layer 22, which may include hydrogenated amorphous Si (a-Si:H), and a doped emitter layer 24, which may include doped a-Si:H, e.g., p+ doped with an n-type substrate 12, although an n-doped layer may also be employed with an n-type substrate. The doped layer 24 may have a thickness of less than 10 nm, and the passivation layer 22 may have a thickness of less than 10 nm.

A transparent conductive material or layer 26 such as a transparent conductive oxide (TCO) is formed to reduce lateral resistance for carrier collection at the electrodes. Examples of the transparent conductive layer 26 include but are not limited to indium-tin-oxide (ITO) and aluminum-doped zinc-oxide (ZnO:Al or AZO). The TCO layer 26 may serve as a back-reflector in combination with a reflective metal contact 28 employed in a monofacial structure (e.g., receiving light from one side (the front side 30)).

In useful embodiments, the passivation layers 14 and 22 as well as the doped layers 16 and 24 may include hydrogenated amorphous Si (a-Si:H), hydrogenated nano-crystalline Si (nc-Si:H), or combinations thereof. The passivation layers 14 and 22 with Si:H are preferably intrinsic although they may be doped lighter than and with a same doping type as that of the doped layer 16 or 24 they are in contact with. The passivation layers 14 and 22 with Si:H may include C, Ge, Cl, F, D (deuterium), 0, N, or combinations thereof.

Other passivation layers may be employed in addition to or instead of layers 14 and 22. It should be understood that the present principles may be applied to another structure, but are particularly useful with amorphous structures since these structures have increased vulnerability to high temperature processes.

While substrate 12 and layers 16 and 24 are illustratively described to include Si, semiconducting material(s) for forming these structures may also include Ge, $SiGe_x$, $SiC_x$, etc. or combinations of these materials and may or may not contain hydrogen. The passivation layers 14 and 22 may include amorphous, nanocrystalline, microcrystalline or polycrystalline films(s) of Si, Ge, $SiGe_x$, $SiC_x$, $SiO_x$, $SiN_x$, or combinations of these materials and may or may not contain hydrogen and may or may not contain fluorine or deuterium. The reflective metal contact 28 may include a metal such as aluminum, silver, tungsten, copper, etc. The metal contact 28 may be formed using a plating process similar to the formation of the metal fingers 20.

In a bifacial device, the metal contact 28 may be replaced with a metal grid or fingers (20). In such an embodiment, the layer 26 may include a multi-layer ARC stack. The stack may be optimized for lower reflection, e.g., a top ARC (that receives incident radiation first) may include a lower refractive index than an underlying ARC of layer 26. The refractive indices of the ARC layers, which may include ITO as the lower ARC (conductive) and $MgF_2$ as the top ARC (dielectric), may have optimized thicknesses to reduce reflection of the solar spectrum. In some embodiments, the barrier layer 19 may include or be employed as an ARC. For example, the transparent conductor 18 and the barrier layer(s) 19 may form a multi-layer ARC. If, e.g., ITO is employed as a transparent conductor 18 and SiN as the barrier layer 19, the ITO/SiN forms a double-layer ARC.

A plating process for the formation of metal contacts (grid 20) will be described in greater detail with respect to the following FIGS.

Figure 2:
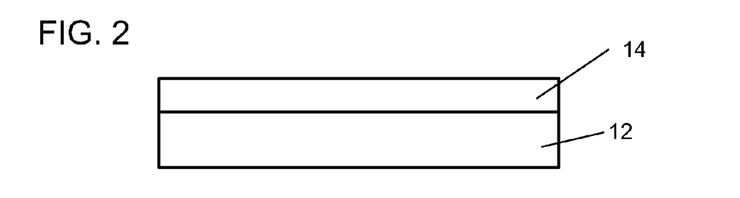
FIG. 2 is a cross-sectional view of a substrate having a passivation layer formed thereon in accordance with the present principles.

Referring to FIG. 2, in accordance with illustrative embodiments, the passivation layer 14 is formed on the substrate 12. The passivation layer 14 may be deposited by plasma-enhanced chemical vapor deposition (PECVD) at temperatures in the range of between about 150° C. to about 250° C., although higher or lower temperatures are also possible. Other techniques such as hot-wire CVD or remote-plasma CVD may be also employed. Gas precursors may include but are not limited to silane, disilane, or dichlorosilane, and may or may not be mixed by hydrogen. Dopant gases include but are not limited to phosphine and arsine for $n^+$ doping, and diborane or tetramethylborane (TMB) for $p^+$ layers.

Figure 3:
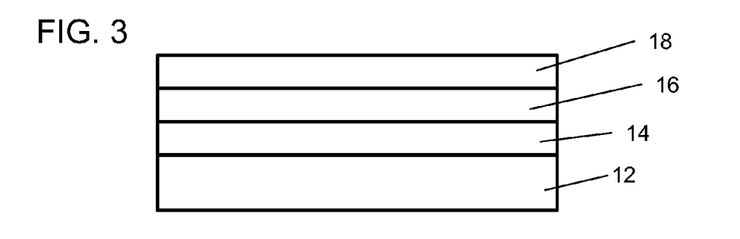
FIG. 3 is a cross-sectional view of the substrate of FIG. 2 having a doped layer formed on the passivation layer and a transparent conductor layer formed on the doped layer in accordance with the present principles.

Referring to FIG. 3, the doped layer 16 is deposited over the passivation layer 14 and may be formed using a same or similar process (e.g., and adding dopants or increasing dopant concentration) employed for forming the passivation layer 14. In one embodiment, the passivation layer 14 and doped layer 16 include a-Si. The passivation layer 14 may include intrinsic a-Si and the doped layer 16 may include doped a-Si. The TCO layer 18 is deposited over the doped layer 16. The TCO layer 18 may be formed by a sputtering process although CVD or other formation processes may be employed. The TCO layer 18 may include ITO, AZO or other TCO material or materials. The TCO layer 18 may include a thickness of about 75 to about 100 nm, although greater or lesser thicknesses are contemplated.

In one embodiment, the layer 18 may include a multi-layer ARC stack, as described above. The stack may include ITO as the lower ARC (conductive) and $MgF_2$ as the top ARC (dielectric). Other materials may also be employed.

Figure 4:
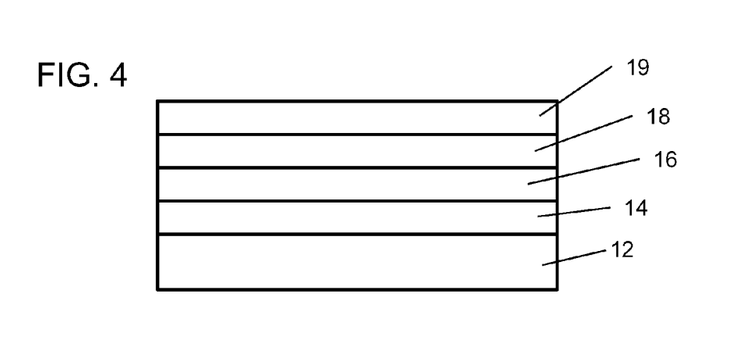
FIG. 4 is a cross-sectional view of the substrate of FIG. 3 having a barrier layer formed on the transparent conductor layer in accordance with the present principles.

Referring to FIG. 4, a barrier layer 19 is formed over the TCO layer 18. The barrier layer 19 preferably includes a thin dielectric layer (e.g., between about 5 to about 10 nm, although other dimensions may be employed). The barrier layer 19 may include a silicon nitride, silicon dioxide or other dielectric material that is selectively removable relative to the underlying TCO layer 18. In one embodiment, the barrier layer 19 should be thin enough or include material that is transparent to incident radiation so that operation of the photovoltaic device is not impacted. In another embodiment, the barrier layer 19 may include a thicker, non-conducting, etchable material, such as an ARC material, e.g., $MgF_2$ and be optimized to provide antireflection properties. The barrier layer 19 may also be comprised of a plurality of transparent layers and/or antireflection layers.

Figure 5:
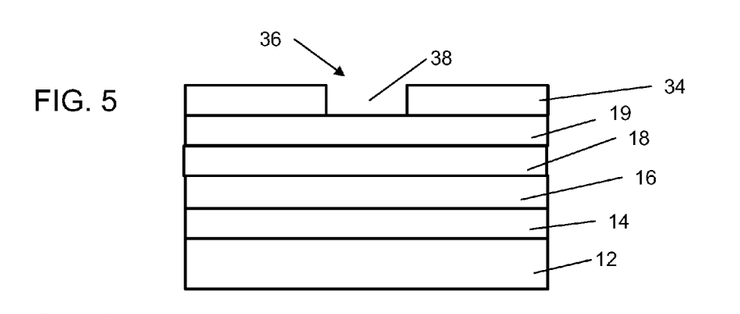
FIG. 5 is a cross-sectional view of the substrate of FIG. 4 having a patterned resist formed on the barrier layer in accordance with the present principles.

Referring to FIG. 5, in one embodiment, the barrier layer 19 is patterned by depositing, exposing and developing a resist layer 34 to form a resist mask pattern 36. In another embodiment, the resist pattern 36 is printed on the surface of the barrier layer 19. Other patterning methods may also be employed. The resist mask pattern 36 includes openings 38 where the barrier layer 19 will be etched to remove the barrier layer 19 from the TCO layer 18.

Figure 6:
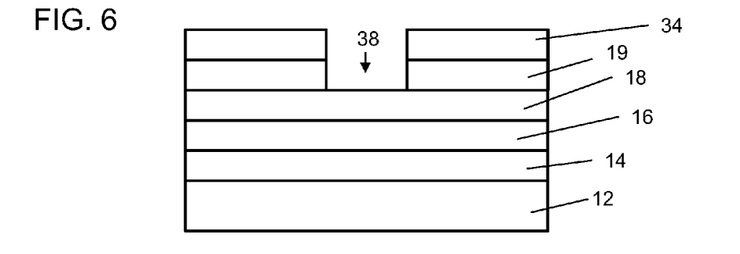
FIG. 6 is a cross-sectional view of the substrate of FIG. 5 having the barrier layer etched using the patterned resist as a mask in accordance with the present principles.

Referring to FIG. 6, the barrier layer 19 is etched by, e.g., a reactive ion etch (RIE) process to expose the TCO layer 18. The exposed portions of the TCO layer 18 may be employed to grow metal or be employed to grow a seed layer to start plating growth as will be described. Depending on the size of the conductive contact needed to be formed the pattern may include a higher or lower density of openings or the openings may include a higher or lower surface area, as needed.

Figure 7:
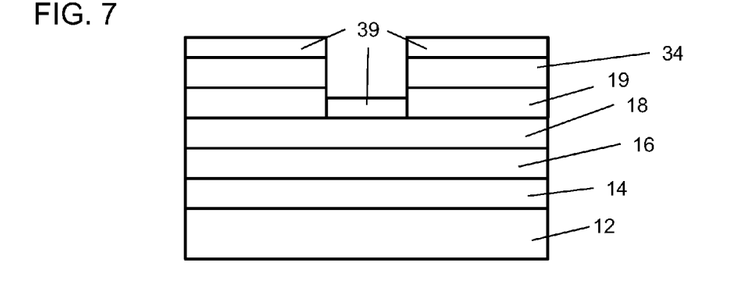
FIG. 7 is a cross-sectional view of the substrate of FIG. 6 having a seed layer optionally formed on the resist layer and on exposed areas of the transparent conductor in accordance with the present principles.

Referring to FIG. 7, in one embodiment, an optional seed layer 39 is deposited over a surface of the resist layer 34 and in contact with the exposed TCO layer 18. The seed layer 39 is preferably thin, e.g., 10 nm or less. The seed layer 39 may include Ni, Cr, Ti, Pd, Al or combinations thereof, e.g., multilayers including Ti/Pd, Ti/Ni, Al/Pd, etc. In some embodiments, the seed layer 39 is comprised of particulates selectively formed on the exposed surface of TCO 18 rather than a continuous film. In one embodiment, Pd particulates are formed on the surface of the TCO 18 by a catalytic surface reaction using, e.g., a $SnCl_2/PdCl_2$ solution. This configuration would appear as in FIG. 8.

Figure 8:
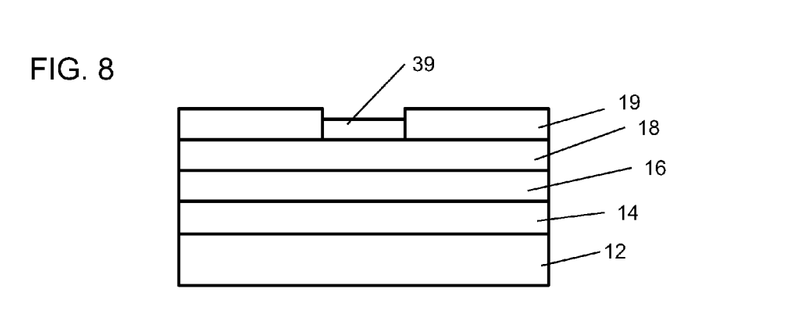
FIG. 8 is a cross-sectional view of the substrate of FIG. 7 having the resist layer and the seed layer thereon removed using a lift-off process in accordance with the present principles.

Referring to FIG. 8, the resist layer 34 is removed to expose the barrier layer 19. In one embodiment, the seed layer 39 is formed on the resist layer 34, and the removal of the resist layer also removes the seed layer 39 formed on the resist layer 34 in a lift-off process. In another embodiment, seed layer particulates are formed on the surface of the TCO 18 by a catalytic surface reaction as described.

Figure 9:
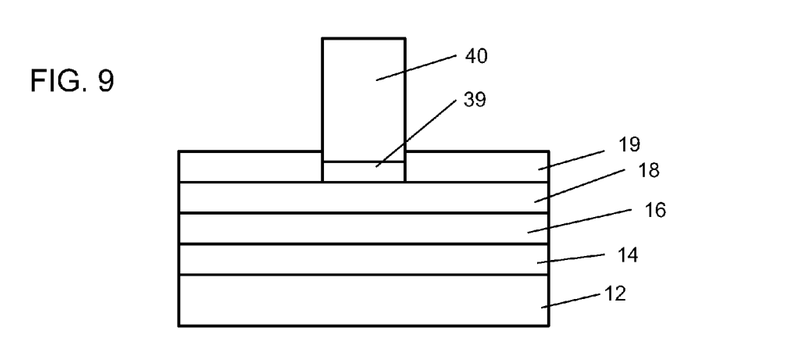
FIG. 9 is a cross-sectional view of the substrate of FIG. 8 showing a plated conductive contact formed on the seed layer in accordance with the present principles.

Referring to FIG. 9, a plated metal is selectively deposited on the seed layer 39 or on the exposed TCO layer 18 to form a self-aligned metal grid or conductive contact 40. The contact 40 may include a height of between 1 to 10 microns, although larger or smaller dimensions are contemplated. The conductive contact 40 may include any suitable conductive material that can be electroplated, electrolessly plated or light-induced plated in a low temperature process. The conductive contact 40 may include, e.g., Cu, Ag, Ni, Au, Pt, W, Al, etc. For electroless plating, the substrate 12 may be either n or p type, and for light-induced plating, the substrate is preferably p type.

The plating process preferably includes submerging a device to be plated into a bath which may include, but is not limited to, one or more of the following: (1) a source of plating metal ions, (2) a reducing agent, (3) a catalyst, (4) other stabilizing components. In one preferred embodiment, this may include a $CuSO_4$/HCl solution for the formation of copper contacts, which is preferably maintained between room temperature (20 degrees C.) and 200 degrees C. and preferably 20-50 degrees C. The low temperature process permits high quality conductive contacts to be formed without damaging amorphous or other material structures of the device. Temperatures above room temperature may be employed to optimize growth rate/adhesion properties.

By employing a barrier layer 19 or layers, the transparent conductor 18 is protected other than in areas to be plated. In one embodiment, the barrier layer 19 may be removed from between adjacent contacts 40 by a selective etching process. In other embodiments, the barrier layer 19 remains on the finished device.

It should be understood that FIG. 9 shows a front or back side contact (30 or 32, in FIG. 1) and that the other of the back side or front side contact (32 or 30) can be formed, but need not be formed on the substrate 12 in a similar fashion as described. In a particularly useful embodiment, a bifacial structure may be employed with metal fingers or grids (20) on both sides of the substrate 12. In such as structure, light enters from both front and back contacts (with metal grids 20 provided for both sides) as opposed to a mono-facial device where light enters from one-side (see, e.g., FIG. 1).

Figure 10:
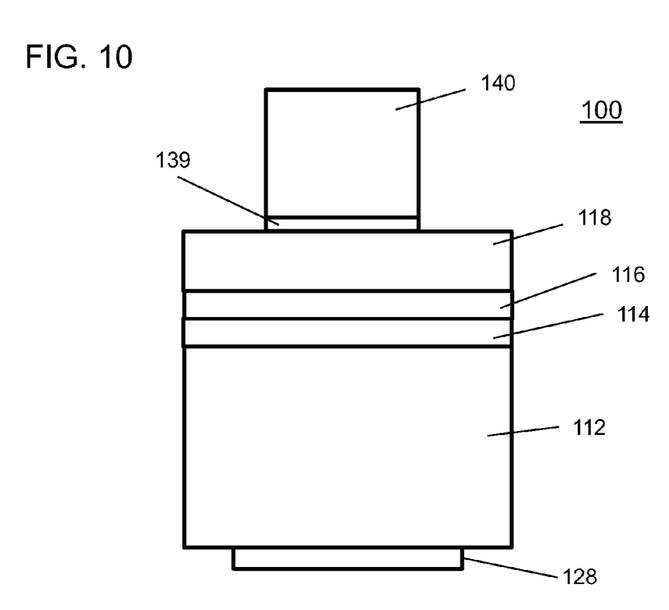
FIG. 10 is a cross-sectional view of a heterojunction photovoltaic device employed in collecting performance measurements in accordance with the present principles.

Referring to FIG. 10, a test photovoltaic cell 100 was fabricated in accordance with the present principles. The cell 100 included a p⁻ doped crystalline Si substrate 112 having an intrinsic hydrogenated amorphous Si passivation layer 114 formed thereon. An n+ doped hydrogenated amorphous Si layer 116 was formed on the passivation layer 114. A TCO layer 118 included ITO formed on the doped layer 116. A seed layer 139 included a Ti/Pd multilayer in one embodiment and Ti/Ni multilayer in another embodiment. A plated Cu contact 140 was grown from the seed layer 139. A bottom contact 128 includes Al. Table 1 shows the seed dimensions, maximum power ($P_{max}$), open circuit voltage ($V_{oc}$), short circuit current ($I_{sc}$) and the fill factor (FF) obtained for the test structure 100 in accordance with illustrative measurements. The contact resistance was measured to be between $1-3 \times 10^{-3}$ $\phi \cdot cm^2$.

TABLE 1

| Seed | $P_{max}$ (mW) | $V_{oc}$ (mV) | $I_{sc}$ (mA) | FF (%) |
|---|---|---|---|---|
| Ti (5 nm)/Pd (5 nm) | 8.44 | 603 | 17.4 | 80.4 |
| Ti (5 nm)/Ni (<5 nm) | 8.54 | 599 | 18.0 | 79.2 |

Figure 11:
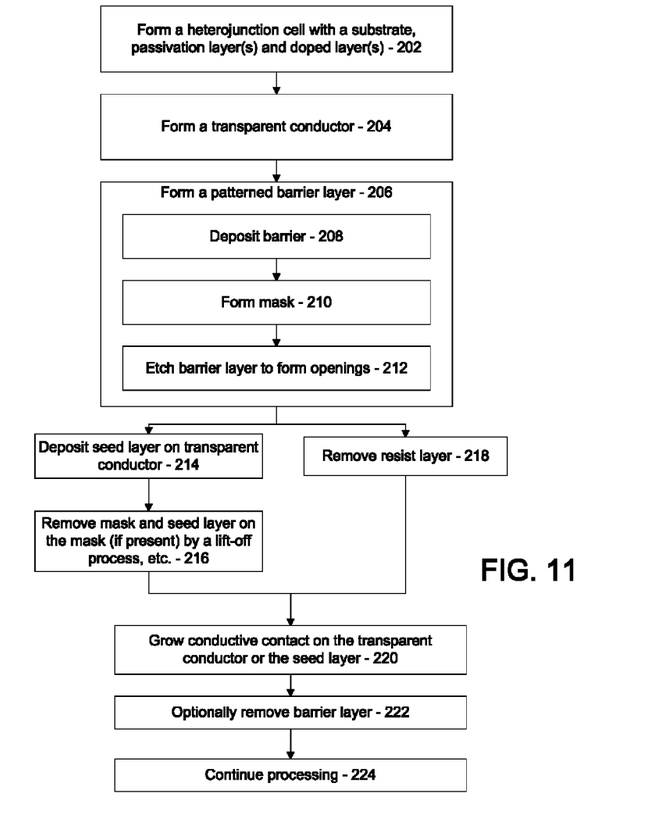
FIG. 11 is a block/flow diagram showing methods for fabricating a heterojunction photovoltaic device using a plating process to form conductive contacts in accordance with the present principles.

Referring to FIG. 11, a block/flow diagram shows methods for fabricating a heterojunction photovoltaic device using a plating process to form conductive contacts in accordance with the present principles. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, a heterojunction cell is formed. The heterojunction cell includes a front contact and may include a back contact. The cell includes a doped crystalline substrate and at least one passivation layer and at least one doped layer. The passivation layer(s) and/or the doped layer(s) may include an amorphous phase although other phases may be used (e.g., crystalline, micro or nanocrystalline, etc.). The passivation layer(s) may be intrinsic layers. In block 204, a transparent conductor is formed on the cell. The transparent conductor may be formed on the front side and/or on the back side of the cell. The transparent conductor may include TCO, and may include a plurality of ARC layers.

In block 206, a patterned barrier layer, which may include a plurality of layers, is formed on the transparent conductor. The patterned barrier layer may be formed by depositing a barrier layer over the transparent conductor in block 208. A resist or other hard/soft mask is patterned over the barrier layer in block 210. The resist mask may be formed and patterned in a plurality of ways. For example, the resist mask may be deposited and developed, printed onto the barrier layer, etc. In block 212, the barrier layer is etched through openings in the resist mask to expose portions of the transparent conductor through the openings in the barrier layer.

In block 214, a seed layer may optionally be deposited over the resist layer and the exposed portions of the transparent conductor. Alternately, the seed layer may be selectively grown on exposed portions of the transparent conductor. In block 216, the resist layer and seed layer on the resist layer (if present) are removed by a lift-off or other process. In block 218, if the seed layer is not employed, remove the resist layer.

In block 220, a conductive contact is grown through the openings in the patterned barrier layer by a selective plating process. The conductive contact may be grown on the transparent conductor through the openings. If a seed layer is employed the conductive contact is grown on the seed layer. The selective plating process may include at least one of electroplating, electroless plating, and light-induced plating. The selective plating process is preferably performed at a temperature of less than about 200 degrees C.

In block 222, the barrier layer may optionally be removed. In block 224, the process continues to complete the device.

Having described preferred embodiments for selective self-aligned plating of heterojunction solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming contacts on a photovoltaic device, comprising:
    forming a heterojunction cell including a substrate, at least one passivation layer on the substrate, and at least one doped layer on the passivation layer, the passivation layer being disposed between the substrate and the doped layer;
    forming a transparent conductor on the doped layer;
    forming a patterned barrier layer on the transparent conductor having openings therein wherein the transparent conductor is exposed through the openings in the barrier layer; and
    growing a conductive contact through the openings in the patterned barrier layer by a selective plating process.

2. The method as recited in claim 1, wherein forming the heterojunction cell includes forming one or more amorphous material layers for the at least one passivation layer and the at least one doped layer.

3. The method as recited in claim 1, wherein forming the transparent conductor on the cell includes forming an antireflection coating multilayer.

4. The method as recited in claim 1, wherein forming the patterned barrier layer includes patterning or printing a mask layer.

5. The method as recited in claim 1, wherein growing a conductive contact through the openings includes growing the conductive contact on the transparent conductor through the openings.

6. The method as recited in claim 1, further comprising:
    growing a seed layer on exposed areas of the transparent conductor through the openings and wherein growing the conductive contact includes growing the conductive contact on the seed layer.

7. The method as recited in claim 1, wherein the selective plating process includes at least one of electroplating, electroless plating, light-induced plating.

8. The method as recited in claim 1, wherein the selective plating process is performed at a temperature of less than about 200 degrees C.

9. A method for forming contacts on a photovoltaic device, comprising:
    forming a heterojunction cell including a substrate, at least one passivation layer and at least one doped layer;
    depositing a transparent conductor on the cell;
    depositing a barrier layer over the transparent conductor;
    patterning a mask over the barrier layer;
    etching the barrier layer through openings in the mask to expose portions of the transparent conductor through the openings in the barrier layer;
    depositing a seed layer over the mask and the exposed portions of the transparent conductor;
    removing the mask and seed layer on the mask by a lift-off process; and
    growing a conductive contact through the openings in the barrier layer on the seed layer by a selective plating process.

10. The method as recited in claim 9, wherein forming the heterojunction cell includes forming one or more amorphous material layers for the at least one passivation layer and the at least one doped layer.

11. The method as recited in claim 9, wherein forming the transparent conductor on the cell includes forming an antireflection coating multilayer.

12. The method as recited in claim 9, wherein patterning a mask includes printing a mask.

13. The method as recited in claim 9, wherein the selective plating process includes at least one of electroplating, electroless plating, light-induced plating.

14. The method as recited in claim 9, wherein the selective plating process is performed at a temperature of less than about 200 degrees C.

\* \* \* \* \*